(12) United States Patent
Rouvala et al.

(10) Patent No.: US 9,251,966 B2
(45) Date of Patent: Feb. 2, 2016

(54) SUPERCAPACITOR HAVING A CIRCUIT BOARD DEFINING AN ELECTROLYTE CHAMBER

(71) Applicant: Nokia Technologies Oy, Espoo (FI)

(72) Inventors: Markku Rouvala, Helsinki (FI); Yinglin Liu, Cambridge (GB); Piers Andrew, Cambridge (GB); Pritesh Hiralal, Las Palmas (ES); Haolan Wang, Cambridge (GB); Gehan Amaratunga, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/813,190

(22) Filed: Jul. 30, 2015

(65) Prior Publication Data

US 2015/0332867 A1  Nov. 19, 2015

Related U.S. Application Data (63) Continuation of application No. 13/825,987, filed as application No. PCT/IB2010/002463 on Sep. 28, 2010, now abandoned.

(51) Int. Cl.
| | | |
|---|---|---|
| *H01G 11/00* | (2013.01) |
| *H01G 11/22* | (2013.01) |
| *H01G 11/52* | (2013.01) |
| *H01G 11/54* | (2013.01) |
| *H01G 11/32* | (2013.01) |
| *H01G 11/84* | (2013.01) |
| *H05K 1/16* | (2006.01) |
| *H05K 1/18* | (2006.01) |
| *H01G 9/00* | (2006.01) |
| *H01G 11/26* | (2013.01) |
| *H01G 11/24* | (2013.01) |
| *H05K 1/14* | (2006.01) |

(52) U.S. Cl.
CPC ............. *H01G 11/00* (2013.01); *H01G 9/0029* (2013.01); *H01G 11/22* (2013.01); *H01G 11/32* (2013.01); *H01G 11/52* (2013.01); *H01G 11/54* (2013.01); *H01G 11/84* (2013.01); *H05K 1/162* (2013.01); *H05K 1/189* (2013.01); *H01G 11/24* (2013.01); *H01G 11/26* (2013.01); *H05K 1/147* (2013.01); *Y02E 60/13* (2013.01); *Y10T 29/417* (2015.01); *Y10T 156/10* (2015.01)

(58) Field of Classification Search
CPC ....... H01G 11/58; H01G 11/26; H01G 9/042; H01G 9/048; H01G 9/155
See application file for complete search history.

(56) References Cited

U.S. PATENT DOCUMENTS

| | | | |
|---|---|---|---|
| 2007/0139864 A1 | 6/2007 | Dunn et al. | 361/523 |
| 2008/0156886 A1 | 7/2008 | Tsuchiya | 235/492 |
| 2008/0170982 A1 | 7/2008 | Zhang et al. | 423/447.3 |
| 2008/0304207 A1 | 12/2008 | Brandon et al. | 361/502 |
| 2010/0216023 A1 | 8/2010 | Wei et al. | 429/220 |

*Primary Examiner* — Dion R Ferguson
(74) *Attorney, Agent, or Firm* — Harrington & Smith (57) ABSTRACT

An apparatus, the apparatus including first and second circuit boards, and an electrolyte, the first and second circuit boards each including a capacitive element, wherein the apparatus is configured such that a chamber is defined between the first and second circuit boards with the capacitive elements contained therein and facing one another, the chamber including the electrolyte, and wherein the apparatus is configured to store electrical charge when a potential difference is applied between the capacitive elements.

30 Claims, 5 Drawing Sheets

SUPERCAPACITOR HAVING A CIRCUIT BOARD DEFINING AN ELECTROLYTE CHAMBER

CROSS REFERENCE TO RELATED APPLICATIONS

This patent application is a continuation application of copending U.S. patent application Ser. No. 13/825,987, filed on Mar. 26, 2013, which is a national stage entry of PCT/IB2010/002463, filed on Sep. 28, 2010, the disclosures of both applications being incorporated by reference herein in their entireties.

TECHNICAL FIELD

The present disclosure relates to the field of so-called "supercapacitors" and the like, associated apparatus, methods and computer programs, and in particular concerns the integration of a supercapacitor within a flexible printed circuit (FPC) structure. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. telecommunication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Multimedia enhancement modules in portable electronic devices (such as camera flash modules, loudspeaker driver modules, and power amplifier modules for electromagnetic transmission) require short power bursts. Typically, electrolytic capacitors are used to power LED and xenon flash modules and conventional capacitors are used to power loudspeaker driver modules, but neither are able to satisfy the power demands needed for optimal performance.

The situation could be improved by the use of supercapacitors. In an LED flash module, for example, double the light output can be achieved using supercapacitors instead of electrolytic capacitors. The problem is not as straight forward as simply switching one type of capacitor for the other, however. In modern electronic devices, miniaturisation is an important factor, and state-of-the-art supercapacitors do not fulfil the size and performance requirements in currently available packaging. Power sources for modules requiring high power bursts have to be implemented close to the load circuit, which for flash and speaker applications means closer than 10-30 mm. Unfortunately, present supercapacitors are bulky, suffer from electrolyte swelling, and have the wrong form factor for attachment to the circuit boards of portable electronic devices.

In addition, the attachment of supercapacitors requires several undesirable processing steps.

The apparatus and associated methods disclosed herein may or may not address one or more of these issues.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements.

The apparatus may be configured to store electrical charge at the interface between the capacitive elements and the electrolyte. The capacitive elements may be referred to as "electrodes". Each capacitive element may comprise a high surface area material. Each capacitive element may comprise an electrically conductive region having a surface. The electrically conductive region may comprise one or more of the following materials: copper, aluminium, and carbon. The high surface area material may be disposed on the surface of each electrically conductive region. The respective surfaces/high surface area materials of the electrically conductive regions may be configured to face one another.

The electrolyte may be located between the capacitive elements. The electrolyte may comprise first and second ionic species of opposite polarity. The first and second ionic species may be configured to move towards the capacitive element of the first and second circuit boards, respectively, when a potential difference is applied between the capacitive elements. The electrolyte may be an organic electrolyte. The organic electrolyte may be based on an aprotic solvent such as acetonitrile, or on a carbonate-based solvent such as propylene carbonate. The electrolyte may comprise tetraethylammonium tetrafluoroborate in acetonitrile. The electrolyte may be an aqueous electrolyte. The electrolyte may be chosen such that a potential difference of between 0V and 0.9V may be applied between the capacitive elements without the electrolyte undergoing an electrochemical reaction. Advantageously, the electrolyte may be chosen such that a potential difference of between 0V and 2.7V may be applied between the capacitive elements without the electrolyte undergoing an electrochemical reaction.

The high surface area material may be electrically conductive. The high surface area material may comprise one or more of the following: nanoparticles, nanowires, nanotubes, nanohorns, nanofibers and nano-onions. In particular, the high surface area material may comprise one or more of the following: activated carbon, carbon nanowires, carbon nanotubes, carbon nanohorns, carbon nanofibres and carbon nano-onions. The carbon nanotubes may be multiple wall carbon nanotubes.

The apparatus may comprise a separator between the capacitive elements. The separator may be configured to prevent direct physical contact between the capacitive elements. The separator may comprise one or more pores. The pores in the separator may be configured to allow the first and second ionic species to pass through the separator towards the capacitive elements when the potential difference is applied, thereby facilitating charging of the apparatus. Likewise, the pores in the separator may be configured to allow the first and second ionic species to pass through the separator away from the capacitive elements when the apparatus is used to power an electrical component, thereby facilitating discharging of the apparatus. The separator may comprise one or more of the following: polypropylene, polyethylene, cellulose, and polytetrafluoroethylene. The separator may comprise one, two, three, or more than three layers. Each layer may comprise one or more of the above-mentioned materials.

The first and second circuit boards may be separate circuit boards which have been joined together to define the chamber. The first and second circuit boards may be the same circuit board which has been bent around onto itself to define the chamber. The apparatus may comprise a ring between the first and second circuit boards. The ring may be configured to surround the capacitive elements to form the chamber. The ring may be sealingly attached to the first and second circuit boards to contain the electrolyte within the chamber. The first and second circuit boards may be sealed together to contain the electrolyte within the chamber.

The electrically conductive regions may be configured to maximise adhesion of the high surface area material to the surfaces of the electrically conductive regions. The electrically conductive regions may be configured to minimise the electrical resistance of the capacitive elements. The thickness of the high surface area material may be configured to minimise the electrical resistance of the capacitive elements.

The apparatus may be configured to be flexible. The first and second circuit boards may be flexible printed circuit boards. Each of the first and second circuit boards may comprise a layer of electrically conductive material coated on either side by a layer of electrically insulating material. The layer of electrically conductive material may be electrically connected to the electrically conductive region. The layer of electrically conductive material may be electrically connected to the electrically conductive region by one or more of the following: a connector, a vertical interconnect access (VIA) connection, a pogo pin, a solder contact, and a wire. The layer of electrically conductive material may comprise copper. The layer of electrically insulating material may comprise polyimide. The layer of electrically insulating material may be adhered to the layer of electrically conductive material by an adhesive. Each of the first and second circuit boards may comprise a layer of surface protection material between the electrically conductive region and the high surface area material. The layer of surface protection material may comprise an organic surface protection (OSP) material.

The apparatus may form part of a multimedia enhancement module. The multimedia enhancement module may be one or more of the following: a camera flash module, a loudspeaker driver module, and a power amplifier module for electromagnetic transmission. The camera flash module may be an LED camera flash module or a xenon camera flash module. The LED camera flash module may comprise one or more of the following: an LED driver, a capacitor charger, and an LED. The loudspeaker driver module may be a stereo audio loudspeaker driver module. The power amplifier module may be a power amplifier module for RF transmission. The apparatus may be used as a power source for a digital display (such as an LED or LCD screen), or as a power source for a storage medium (such as a hard disk drive, random access memory or flash memory). The apparatus may be configured for use in a portable electronic device. The portable electronic device may be a mobile phone.

According to a further aspect, there is provided a method of producing an apparatus, the method comprising: providing first and second circuit boards, the first and second circuit boards each comprising a capacitive element; configuring the first and second circuit boards to define a chamber between the first and second circuit boards with the capacitive elements contained therein and facing one another; and providing an electrolyte within the chamber to produce an apparatus, the apparatus comprising the first and second circuit boards and the electrolyte, wherein the apparatus is configured to store electrical charge when a potential difference is applied between the capacitive elements.

Each capacitive element may comprise an electrically conductive region having a surface. The method may comprise applying a high surface area material to the surface of each electrically conductive region. The high surface area material may be applied by drop casting or rolling the high surface area material onto the surface of each electrically conductive region. The method may comprise preparing the high surface area material prior to application by mixing one or more of the following together and subsequently homogenising the mixture: activated carbon, carbon nanotubes, carbon nanohorns, carbon nanofibers and carbon nano-onions. One or more of the activated carbon, carbon nanotubes, carbon nanohorns, carbon nanofibers and carbon nano-onions may be mixed together with a binder and solvent. The mixture may be homogenised by stirring the mixture. The method may comprise annealing the high surface area material after application to evaporate the solvent and consolidate the high surface area material. The method may comprise controlling the thickness of the high surface area material on the surface of each electrically conductive region to minimise the electrical resistance of the capacitive elements. The thickness of the high surface area material may be controlled using a rolling film deposition process or an alternative process such as doctor-blading. The method may comprise sealing the first and second circuit boards together to contain the electrolyte within the chamber. The first and second circuit boards may be sealed together by one or more of the following methods: heat lamination, vacuum packing, punching, and soldering.

According to a further aspect, there is provided a method of storing electrical charge, the method comprising: providing an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements; and applying a potential difference between the capacitive elements.

According to a further aspect, there is provided a computer program for controlling the storage of electrical charge using an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements, the computer program comprising code to apply a potential difference between the capacitive elements.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

In electrical circuits, batteries and capacitors are used to provide other components with electrical power. These power supplies operate in completely different ways, however. Batteries use electrochemical reactions to generate electricity. They comprise two electrical terminals (electrodes) separated by an electrolyte. At the negative electrode (the anode), an oxidation reaction takes place which produces electrons. These electrons then flow around an external circuit from the anode to the positive electrode (the cathode) causing a reduction reaction to take place at the cathode. The oxidation and reduction reactions may continue until the reactants are completely converted. Importantly though, unless electrons are able to flow from the anode to the cathode via the external circuit, the electrochemical reactions cannot take place. This allows batteries to store electricity for long periods of time.

Figure 1A:
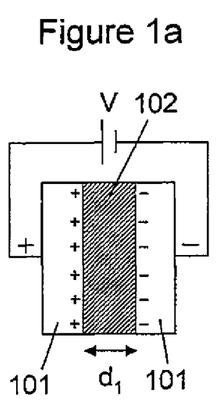
FIG. 1a illustrates schematically a conventional capacitor.

In contrast, capacitors store charge electrostatically, and are not capable of generating electricity. A conventional capacitor (FIG. 1a) comprises a pair of electrical plates 101 separated by an electrical insulator 102. When a potential difference is applied between the plates 101, positive and negative electrical charges build up on opposite plates. This produces an electric field across the insulator 102 which stores electrical energy. The amount of energy stored is proportional to the charge on the plates, and inversely proportional to the separation of the plates, $d_1$. Therefore, the energy storage of a conventional capacitor can be increased by increasing the size of the plates 101 or by reducing the thickness of the insulator 102. Device miniaturisation governs the maximum plate size, whilst material properties dictate the minimum insulator thickness that can be used without conduction of the insulator 102 (breakdown).

Figure 1B:
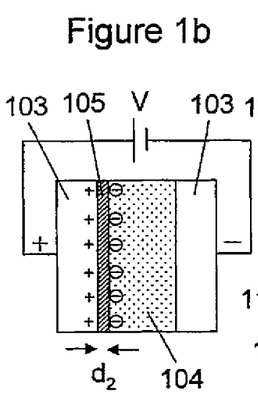
FIG. 1b illustrates schematically an electrolytic capacitor.

Electrolytic capacitors (FIG. 1b) use a special technique to minimise the plate spacing, $d_2$. They consist of two conductive plates 103 separated by a conducting electrolyte 104. When a potential difference is applied, the electrolyte 104 carries charge between the plates 103 and stimulates a chemical reaction at the surface of one of the plates. This reaction creates a layer of insulating material 105 which prevents the flow of charge. The result is a capacitor with an ultrathin dielectric layer 105 separating a conducting plate 103 from a conducting electrolyte 104. In this configuration, the electrolyte 104 effectively serves as the second plate. Since the insulating layer 105 is only a few molecules thick, electrolytic capacitors are able to store a greater amount of energy than conventional parallel plate capacitors.

A third type of capacitor, known as a supercapacitor (FIG. 1c), allows even greater energy storage. Supercapacitors (also known as electric double layer capacitors, ultracapacitors, pseudocapacitors and electrochemical double layer capacitors) have similarities to both electrolytic and conventional capacitors. Like a conventional capacitor, a supercapacitor has two electrically conducting plates 106 that are separated by a dielectric material (a separator) 107. The plates 106 are coated in a porous material 108 such as powdered carbon to increase the surface area of the plates 106 for greater charge storage. Like an electrolytic capacitor (and also a battery), a supercapacitor contains an electrolyte 109 between the conducting plates 106. When a potential difference is applied between the plates, the electrolyte 109 becomes polarised. The potential on the positive plate attracts the negative 110 ions in the electrolyte 109, and the potential on the negative plate attracts the positive ions 111. The dielectric separator 107 is used to prevent direct physical contact (and therefore electrical contact) between the plates 106. The separator 107 is made from a porous material to allow the ions 110, 111 to flow towards the respective plates 106.

Figure 1C:
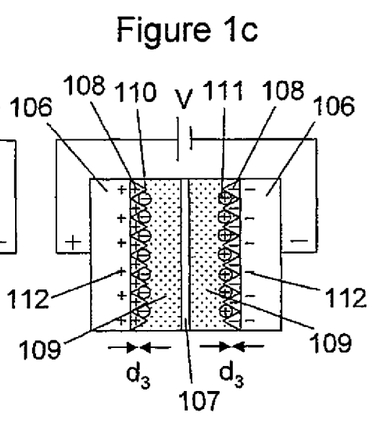
FIG. 1c illustrates schematically an embodiment of a so-called supercapacitor.

Unlike batteries, the applied potential is kept below the breakdown voltage of the electrolyte 109 to prevent electrochemical reactions from taking place at the surface of the plates 106. For this reason, a supercapacitor cannot generate electricity like an electrochemical cell. Also, without electrochemical reactions taking place, no electrons are generated. As a result, no significant current can flow between the electrolyte 109 and the plates 106. Instead, the ions 110, 111 in solution arrange themselves at the surfaces of the plates 106 to mirror the surface charge 112 and form an insulating "electric double layer". In an electrical double layer (i.e. a layer of surface charge 112 and a layer of ions 110, 111), the separation, $d_3$, of the surface charges 112 and ions 110, 111 is on the order of nanometers. The formation of the electric double layer and the use of a high surface area material 108 on the surface of the plates 106 allow a huge number of charge carriers to be stored at the plate-electrolyte interface.

Activated carbon is not the most suitable material 108 for coating the plates 106 of the capacitor, however. The ions 110, 111 in solution are relatively large in comparison to the pores in the carbon, and this limits the energy storage considerably. Recent research in this area has focused on the use of carbon nanotubes and carbon nanohorns instead, both of which offer higher useable surface areas than activated carbon.

Supercapacitors have several advantages over batteries, and as a result, have been tipped to replace batteries in many applications. They function by supplying large bursts of current to power a device and then quickly recharging themselves. Their low internal resistance, or equivalent series resistance (ESR), permits them to deliver and absorb these large currents, whereas the higher internal resistance of a traditional chemical battery may cause the battery voltage to collapse. Also, whilst a battery generally demands a long recharging period, supercapacitors can recharge very quickly, usually within a matter of minutes. They also retain their ability to hold a charge much longer than batteries, even after multiple rechargings. When combined with a battery, a supercapacitor can remove the instantaneous energy demands that would normally be placed on the battery, thereby lengthening the battery lifetime.

Whereas batteries often require maintenance and can only function well within a small temperature range, supercapacitors are maintenance-free and perform well over a broad temperature range. Supercapacitors also have longer lives than batteries, and are built to last until at least the lifetime of the electronic devices they are used to power. Batteries, on the other hand, typically need to be replaced several times during the lifetime of a device.

Supercapacitors are not without their drawbacks, however. Despite being able to store a greater amount of energy than conventional and electrolytic capacitors, the energy stored by a supercapacitor per unit weight is considerably lower than that of an electrochemical battery. In addition, the working voltage of a supercapacitor is limited by the electrolyte breakdown voltage, which is not as issue with batteries.

As mentioned earlier, existing supercapacitors are bulky, suffer from electrolyte swelling and do not have the optimum form factor for attachment to the circuit boards of portable electronic devices. Furthermore, the attachment of existing supercapacitors to circuit boards requires several processing steps, thereby rendering them impractical. There will now be described an apparatus and associated methods that may or may not overcome one or more of these issues.

Figure 2:
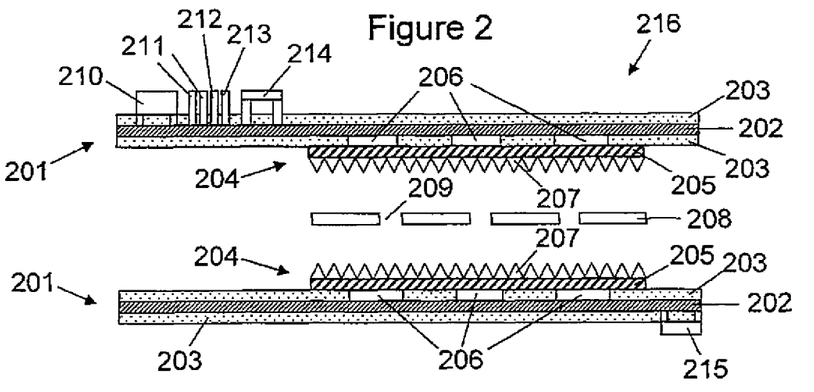
FIG. 2 illustrates schematically (in cross section) a supercapacitor integrated within a flexible printed circuit structure.

In FIG. 2, there is illustrated a supercapacitor integrated within a flexible printed circuit (FPC) structure 216. The use of an FPC structure 216 provides a "flex-to-install solution". Flex-to-install refers to a circuit which is bent or folded during device assembly, but which undergoes minimal flexing during the lifetime of the device. If the FPC structure 216 is sufficiently durable, it may also be suitable for dynamic flex applications in which the circuit board is required to bend both during and after device assembly.

The apparatus consists of two FPC boards 201, each comprising a layer of electrically conductive material 202. In this embodiment, the layer of electrically conductive material 202 on each FPC board 201 is coated on either side by a layer of electrically insulating material 203. Subtraction of the insulating material 203 is used to define conductive traces in the electrically conductive material 202. The insulating material 203 is also used to protect the electrically conductive material 202 from the external environment.

Each FPC board 201 further comprises a capacitive element 204 with an electrically conductive region 205. The electrically conductive regions 205 are electrically connected to the layers of electrically conductive material 202, e.g. by vertical interconnect access (VIA) connections 206. The capacitive elements 204 also comprise a high surface area material 207 on top of the electrically conductive regions 205, the material 207 comprising a mixture of one or more of activated carbon (AC), multiple wall carbon nanotubes (MWNTs), carbon nanohorns (CNHs), carbon nanofibers (CNFs) and carbon nano-onions (CNOs). AC, MWNTs, CNHs, CNFs and CNOs are used because of their large electrical conductivity and high surface area. As mentioned earlier, the high surface area allows adsorption of large numbers of electrolyte ions onto the surface of the capacitive elements 204.

The high surface area material 207 was prepared by mixing different proportions of AC, MWNTs and CNHs together using polytetrafluoroethylene (PTFE) as a binder and acetone as a solvent, and homogenising the mixture by stirring. Following this, the resulting slurry was applied by rolling the mixture onto the surface of each electrically conductive region 205. The FPC boards 201 were then annealed at 50 degrees C. for 20 minutes to drive off the solvent and consolidate the mixture. To maximise its surface area and electrical conductivity, the high surface material 207 was applied to the electrically conductive regions 205 as a thin film.

As shown in FIG. 2, the FPC boards 201 are configured such that the electrically conductive regions 205 (now coated in the high surface area material 207) are facing one another, sandwiching a thin dielectric separator 208 therebetween. The separator 208 prevents direct physical contact (and therefore electrical contact) between the capacitive elements 204, but comprises a number of pores 209 to enable the ions of the electrolyte to move towards the high surface area material 207 when a potential difference has been applied between the capacitive elements 204.

The electrically conductive regions 205 may be formed from a variety of different materials, but advantageously are made from copper, aluminium or carbon. The choice of material affects the physical and electrical properties of the supercapacitor. Copper, and to a lesser extent aluminium, exhibit favourable electrical conductivity. This is advantageous because it allows charge carriers from the electrically conductive layer 202 to flow through the electrically conductive region 205 to the high surface area material 207 with minimum resistance. On the other hand, carbon offers better adhesion to the high surface area material 207 than copper and aluminium, and is more cost effective. Carbon also provides a low resistance (ESR) path between the electrically conductive region 205 and the high surface area material 207. Using carbon, supercapacitors with an ESR of ~3Ω can be produced. Furthermore, the resistance between the electrically conductive layer 202 and the electrically conductive region 205 may be reduced by increasing the number or size of the electrical connections (VIAs) 206. The resistance may also be reduced by removing insulating material 203 from below the electrically conductive region 205 such that electrically conductive region 205 can be deposited directly onto the electrically conductive layer 202.

As mentioned in the background section, supercapacitors may be used to power multimedia enhancement modules in portable electronic devices. For modules that require high power bursts, such as LED flash modules, the supercapacitor needs to be implemented close to the load circuit. In the present case, the FPC structure 216 (within which the supercapacitor is integrated) forms the multimedia enhancement module, with the various components of the module physically (and electrically) connected to the FPC boards 201. In FIG. 2, a surface mounted (SMD) LED 210, two ceramic caps 211, an indicator LED 212, an inductor 213, and a supercapacitor charger and LED driver circuit 214 are (electrically) connected to the electrically conductive layer 202 of the upper FPC board 201, whilst a board-to-board (B2B) connector 215 is (electrically) connected to the electrically conductive layer 202 of the lower FPC board 201. The various electrical components may be soldered or ACF (anisotropic conductive film) contacted to the FPC boards 201. The electrically conductive layers 202 are used to route power to and from the supercapacitor and module components, and the B2B connector 215 (electrically) connects the FPC structure 216 to the main board of the electronic device.

To complete the FPC structure 216, an electrolyte is required between the capacitive elements 204. To achieve this, the FPC boards 201 are configured to form a chamber within which the electrolyte can be contained. The chamber is illustrated in cross-section in FIG. 3a, and in plan view in FIG. 3b. To create the chamber 301, a border 302 around the capacitive elements 303 is defined in plan view. The FPC boards 304 are then sealed together at the border 302 to prevent the electrolyte 305 (which may be a gel or liquid-type electrolyte) from leaking out or evaporating during use. The FPC boards 304 may be sealed by heat lamination, vacuum packing or standard FPC punching processes. A small region (not shown) of the border 302 may remain unsealed until the electrolyte 305 has been introduced into the chamber 301.

Figure 3A:
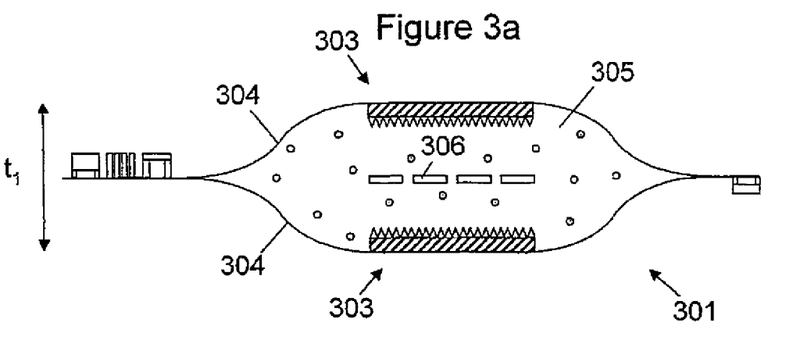
FIG. 3a illustrates schematically the flexible printed circuit structure of FIG. 2 configured to define a chamber between the first and second circuit boards.
Figure 3B:
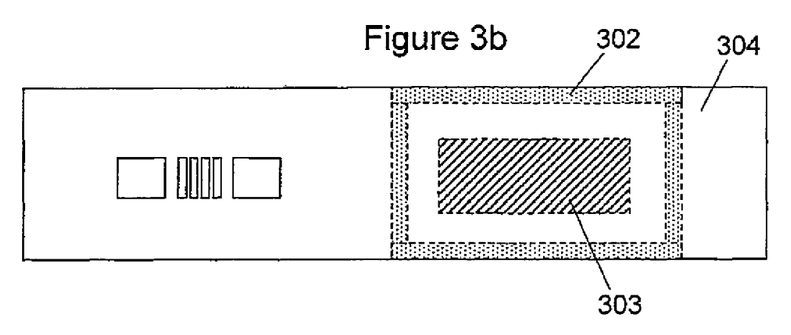
FIG. 3b illustrates schematically the flexible printed circuit structure of FIG. 3a in plan view.

In another embodiment, a ring may be incorporated into the FPC structure to form a chamber. In this embodiment (not shown), the ring is positioned around the capacitive elements 303 and sandwiched between the FPC boards 304. In practise, this may involve placing a first FPC board face-up on a flat surface; placing the ring (which has a diameter of at least the largest in-plane dimension of the capacitive elements 303) around the capacitive element of this FPC board; sealingly attaching the ring to the FPC board; filling the ring with electrolyte 305; placing a second FPC board face-down on top of the first FPC board such that the capacitive element of the second FPC board is contained within the ring and facing the other capacitive element; and sealingly attaching the second FPC board to the ring. Ideally, the thickness of the ring should be substantially the same as the total thickness of the FPC structure. Nevertheless, due to the flexibility of the FPC boards 304, the ring thickness may deviate from the total thickness of the FPC structure and still allow formation of the chamber.

In another embodiment, the ring may comprise an aperture. In this embodiment, the electrolyte may be introduced to the chamber via the aperture and subsequently sealed to retain the electrolyte 305.

Figure 8:
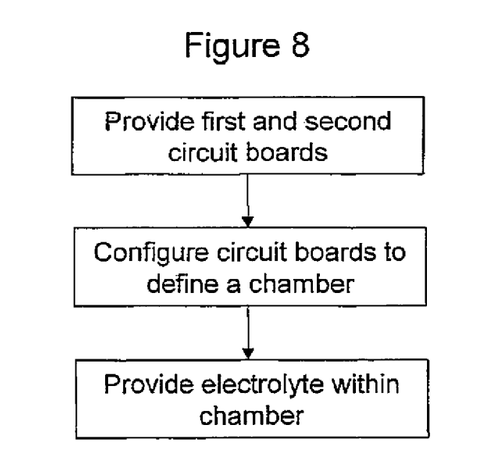
FIG. 8 illustrates schematically a method of producing the apparatus described herein.

It should be noted, however, that the thickness, $t_1$, of the chamber 301 is exaggerated in FIG. 3a. In practice, the capacitive elements 303 and separator 306 are in physical contact to minimise the thickness of the chamber 301. In another embodiment, the capacitive elements 303 may simply be spaced apart from one another. This configuration would remove the need for a separator 306, but may be difficult to maintain if the FPC structure is physically flexible. The key steps of the method used to produce the FPC-integrated supercapacitor are illustrated schematically in FIG. 8. Supercapacitors produced in this way are capable of providing a capacitance of ~40 mF/cm$^2$.

Figure 3C:
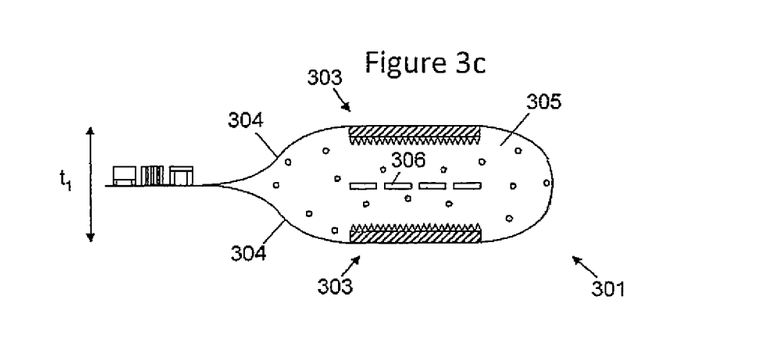
FIG. 3c illustrates schematically a flexible printed circuit structure having a single circuit board bent around itself to form a chamber.

It will be appreciated that, in certain embodiments, one FPC board 304 may be bent around onto itself to define the chamber 301, as shown in FIG. 3c, rather than two separate FPC boards 304 being used.

Figure 4:
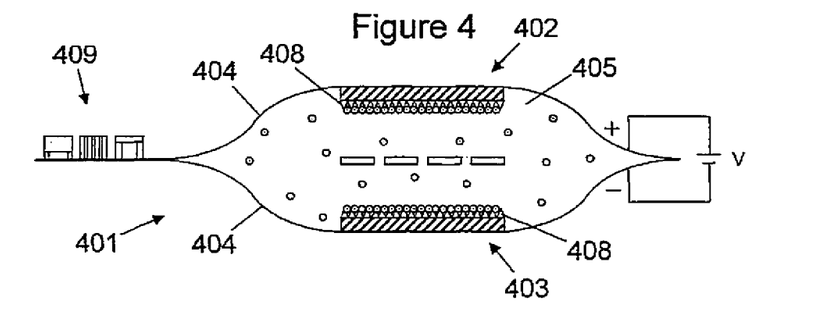
FIG. 4 illustrates schematically the flexible printed circuit structure of FIG. 3a in operation.
Figure 9:
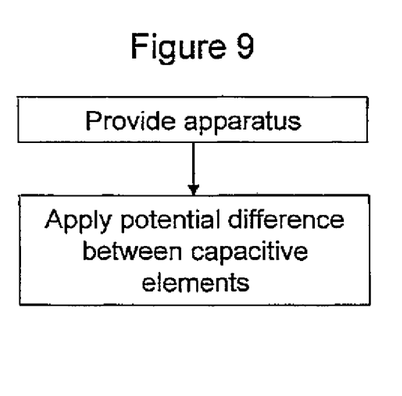
FIG. 9 illustrates schematically a method of storing electrical charge.

With the supercapacitor structure 401 now complete, a potential difference can be applied across the capacitive elements 402, 403 (FIG. 4). This is performed by connecting the positive and negative terminals of a battery to the electrically conductive layers of the respective FPC boards 404. Application of the potential difference polarises the electrolyte 405, causing adsorption of the positive 406 and negative 407 ions onto the exposed surfaces of the high surface area material 408 of the negatively 403 and positively 402 charged capacitive elements, respectively. The key steps of the method used to store electrical charge are illustrated schematically in FIG. 9. The charge stored at the interface between the high surface area material 408 and the electrolyte 405 can be used to power the components of the multimedia enhancement module 409 when the supercapacitor discharges.

Integration of the supercapacitor within the FPC structure increases the possibility of distributed local capacitor placement. This feature enables power to be received from local sources without the resistive and inductive losses caused by electrical junctions (e.g. connectors, vias, pogo pins, solder contacts etc). Supercapacitor integration also reduces the number of manufacturing steps in the assembly phase.

As previously mentioned, the working voltage of a supercapacitor is limited by the breakdown voltage of the electrolyte. There are two types of electrolyte typically used in supercapacitors—aqueous electrolytes and organic electrolytes. The maximum voltage for supercapacitor cells that use aqueous electrolytes is the breakdown voltage of water, ~1.1V, so these supercapacitors typically have a maximum of 0.9V per cell. Organic electrolyte supercapacitors are rated in the range 2.3V-2.7V per cell, depending on the electrolyte used and the maximum rated operating temperature. In order to increase the working voltage of a supercapacitor, several supercapacitor cells may be connected in series.

Figure 5A:
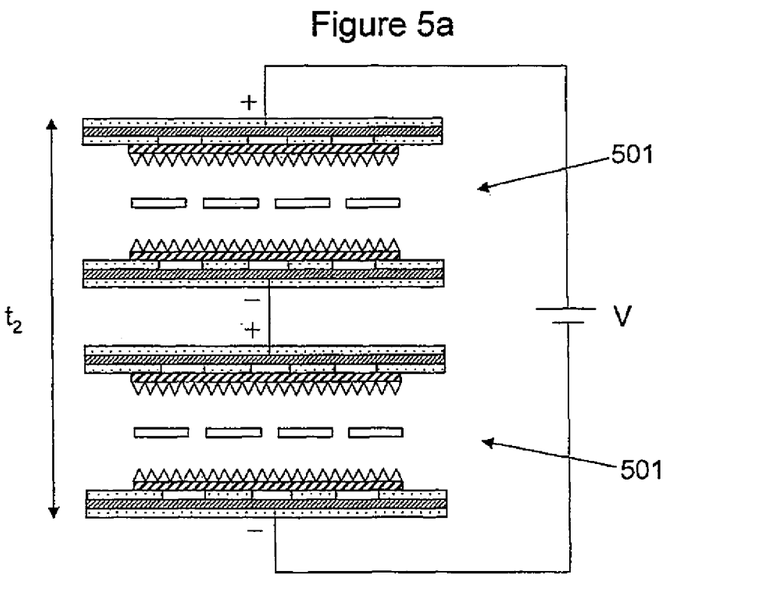
FIG. 5a illustrates schematically two flexible printed circuit structures connected in series.
Figure 5B:
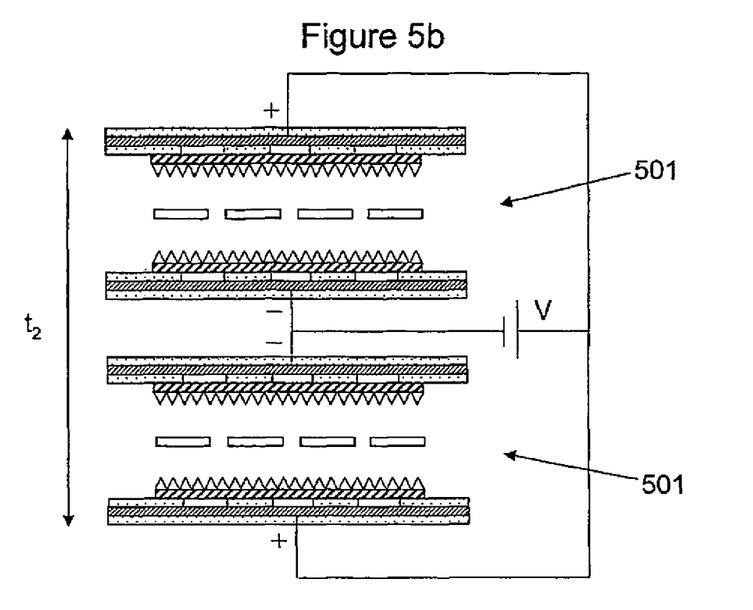
FIG. 5b illustrates schematically two flexible printed circuit structures connected in parallel.

FIG. 5a shows two FPC-integrated supercapacitors 501 connected in series. In this configuration, the total capacitance and maximum working voltage are given by $1/C_{total}=1/C_1+1/C_2$ and $V_{max}=V_1+V_2$, respectively. Therefore, although the working voltage is increased relative to a single FPC-integrated supercapacitor 501, the capacitance of the stack is reduced. The capacitance may be increased by connecting the FPC-integrated supercapacitors 501 in parallel, as shown in FIG. 5b. In this configuration, the total capacitance and maximum working voltage are given by $C_{total}=C_1+C_2$ and $V_{max}=V_1=V_2$, respectively. Therefore, although the capacitance of the stack is increased, the working voltage remains the same as that of a single FPC-integrated supercapacitor 501. A disadvantage of stacking the FPC-integrated supercapacitors 501, however, is the increase in thickness, $t_2$, of the FPC structure which reduces its flexibility.

To test the behaviour of the FPC-integrated supercapacitors 501, cyclic voltammetry experiments were performed using a 5 cm$^2$-area supercapacitor with a 1M solution of tetraethylammonium tetrafluoroborate in acetonitrile as the electrolyte. Cyclic voltammetry is a type of potentiodynamic electrochemical measurement which involves increasing the electrode potential linearly with time whilst measuring the current. This ramping is known as the experiment scan rate (V/s). In this case, a scan rate of 50 mV/s was used. Once the voltage reaches a set potential, the potential ramp is inverted. This inversion is usually performed a number of times during a single experiment. The current is then plotted against the applied voltage to give the cyclic voltammogram trace.

This experiment produced a rectangular trace (not shown) indicating good capacitor behaviour. Furthermore, during the experiment the applied voltage was increased to 2.7V without degradation of the supercapacitor performance.

Following this, the effect of varying the number of separator layers 208 in the supercapacitor 501 was studied. Again, these experiments were performed using 5 cm$^2$-area supercapacitors with a 1M solution of tetraethylammonium tetrafluoroborate in acetonitrile as the electrolyte. It was found that an increase in the number of separator layers from 1 to 2 caused an increase in capacitance and a decrease in ESR. The same trend was observed when the number of separator layers was increased from 2 to 3. This may be attributed to a greater number of pores available to accommodate the ionic species in the electrolyte, which may allow more ions to interact with the high surface material. When the number of separator layers was increased beyond 3, however, there was no further change in capacitance.

Charge-discharge (V) curves (not shown) cycled at ±1 mA (+1 mA for charging the cell and −1 mA for discharging the cell, each cycle lasting 20 secs) revealed capacitances of between 250-649 mF with ESRs of between 5.35-1.8Ω. The capacitance was deduced from the slope of the discharging curve where C=1/(dV/dt), C is the capacitance of the cell in farads, 1 is the discharge current in amperes, and dV/dt is the slope in volts per second. The direct current ESR was calculated using ESR=dV/dl, where dV is the voltage drop at the beginning of the discharge in volts, and dl is the current change in amperes.

The effect of varying the high surface material 207 in the supercapacitor 501 was also studied. Three formulations of high surface material were tested: 97% activated carbon and 3% PTFE (binder), (ii) 87% activate carbon, 10% carbon nanotubes and 3% PTFE, and (iii) 77% activated carbon, 20% carbon nanotubes and 3% PTFE. Again, these experiments were performed using 5 cm$^2$-area supercapacitors with a 1M solution of tetraethylammonium tetrafluoroborate in acetonitrile as the electrolyte.

Cyclic voltammetry experiments produced rectangular traces (not shown) for each sample, indicating good capacitor behaviour. Furthermore, charge-discharge (V) curves (not shown) cycled at ±1 mA revealed respective capacitances of 476, 500 and 649 mF with respective ESRs of 2.3, 1.8 and 1.8Ω. The increase in capacitance and decrease in ESR with nanotube content may be attributed to the high surface area and high electrical conductivity of the carbon nanotubes.

Figure 6:
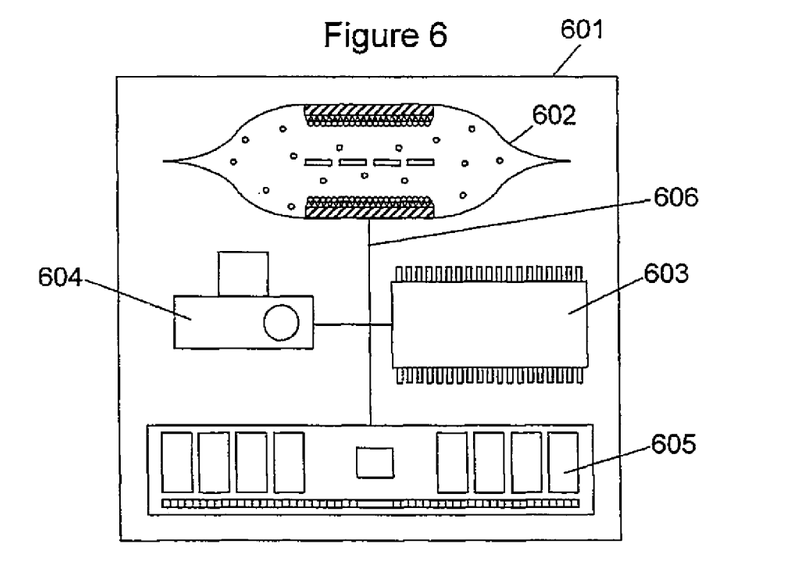
FIG. 6 illustrates schematically a device comprising the apparatus described herein.

FIG. 6 illustrates schematically an electronic device 601 comprising an FPC-integrated supercapacitor 602. The device also comprises a processor 603, a multimedia apparatus 604, and a storage medium 605, which may be electrically connected to one another by a data bus 606. The device 601 may be a portable telecommunications device, whilst the multimedia apparatus 604, may be a built-in camera, loudspeaker or transmitter of electromagnetic signals.

The FPC structure 602 (within which the supercapacitor is integrated) forms a multimedia enhancement module for the multimedia apparatus 604. The supercapacitor itself is used to store electrical charge for powering the various components of the multimedia enhancement module which are physically (and electrically) connected to the FPC boards 607. The multimedia enhancement module may be a camera flash module, a loudspeaker driver module, or a power amplifier module for electromagnetic signal transmission.

The processor 603 is used to provide signalling to control the charging and discharging of the FPC-integrated supercapacitor 602. Typically, the supercapacitor 602 will discharge whenever the multimedia enhancement module requires a short current burst. Where the multimedia apparatus 604 is a camera, for example, a short burst of current will be required whenever the user of the device 601 wishes to take a photograph using the camera flash. In this scenario, the processor 603 would provide signalling to instruct the supercapacitor 602 to discharge and provide the flash with the required current.

After the supercapacitor 602 has discharged, the processor 603 would instruct the supercapacitor 602 to recharge using a connected battery. The use of a supercapacitor 602 therefore removes the instantaneous energy demands that would normally be placed on the battery.

The storage medium 605 may be used to store device settings. For example, the storage medium 605 may be used to store specific current/voltage setting for the various electrical components (e.g. the components of the multimedia enhancement module or the components of the multimedia apparatus 604). In particular, the storage medium 605 may be used to store the voltage setting of the supercapacitor 602. The processor 603 could then access the storage medium 605 to retrieve the desired information before instructing the supercapacitor 602 to recharge using the battery potential. The storage medium 605 may be a temporary storage medium such as a volatile random access memory. On the other hand, the storage medium 605 may be a permanent storage medium such as a hard disk drive, a flash memory, or a non-volatile random access memory.

Figure 7:
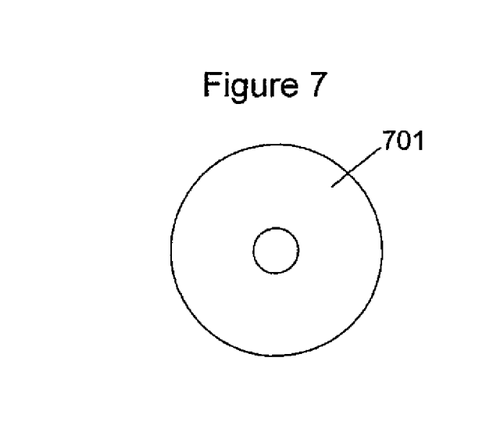
FIG. 7 illustrates schematically a computer readable media providing a program.

FIG. 7 illustrates schematically a computer/processor readable media 701 providing a computer program according to one embodiment. In this example, the computer/processor readable media is a disc such as a digital versatile disc (DVD) or a compact disc (CD). In other embodiments, the computer readable media may be any media that has been programmed in such a way as to carry out an inventive function. The readable media may be a removable memory device such as a memory stick or memory card (SD, mini SD or micro SD).

The computer program may comprise code for controlling the storage of electrical charge using an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements, the computer program comprising code to apply a potential difference between the capacitive elements.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/ circuitry/elements/processor may have other functions in addition to the mentioned functions, and that these functions may be performed by the same apparatus/circuitry/elements/ processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, wherein the apparatus is configured to store electrical charge when a potential difference is applied between the capacitive elements, and wherein the first and second circuit boards are defined by layers of electrically conductive material coated on either side by a layer of electrically insulating material.

2. The apparatus of claim 1, wherein each capacitive element comprises a high surface area material.

3. The apparatus of claim 2, wherein each capacitive element comprises an electrically conductive region having a surface, the high surface area material disposed on the surface of each electrically conductive region, the respective surfaces/high surface area materials of the electrically conductive regions configured to face one another.

4. The apparatus of claim 1, wherein the electrolyte is located between the capacitive elements.

5. The apparatus of claim 1, wherein the apparatus comprises a separator between the capacitive elements, the separator configured to prevent direct physical contact between the capacitive elements.

6. The apparatus of claim 1, wherein the apparatus is configured to store electrical charge at the interface between the capacitive elements and the electrolyte.

7. The apparatus of claim 2, wherein the high surface area material is electrically conductive.

8. The apparatus of claim 2, wherein the high surface area material comprises one or more of the following: activated carbon, carbon nanotubes, carbon nanohorns, carbon nanofibers and carbon nano-onions.

9. The apparatus of claim 1, wherein the electrolyte comprises first and second ionic species of opposite polarity, the first ionic species configured to move towards the capacitive element of the first circuit board and the second ionic species configured to move towards the capacitive element of the second circuit board when the potential difference is applied between the capacitive elements.

10. The apparatus of claim 1, wherein the electrolyte is chosen such that a potential difference of between 0V and 2.7V may be applied between the capacitive elements without the electrolyte undergoing an electrochemical reaction.

11. The apparatus of claim 9, wherein the apparatus comprises a separator between the capacitive elements, the separator comprising one or more pores, the pores in the separator configured to allow the first and second ionic species to pass through the separator.

12. The apparatus of claim 1, wherein the first and second circuit boards are separate circuit boards which have been joined together to define the chamber.

13. The apparatus of claim 1, wherein the first and second circuit boards are the same circuit board which has been bent around onto itself to define the chamber.

14. The apparatus of claim 1, wherein the apparatus comprises a ring between the first and second circuit boards, the ring configured to surround the capacitive elements to form the chamber.

15. The apparatus of claim 14, wherein the ring is sealingly attached to the first and second boards to contain the electrolyte within the chamber.

16. The apparatus of claim 1, wherein the first and second circuit boards are sealed together to contain the electrolyte within the chamber.

17. The apparatus of claim 3, wherein the electrically conductive regions are configured to maximise adhesion of the high surface area material to the surfaces of the electrically conductive regions.

18. The apparatus of claim 3, wherein the electrically conductive regions are configured to minimise the electrical resistance of the capacitive elements.

19. The apparatus of claim 2, wherein the thickness of the high surface area material is configured to minimise the electrical resistance of the capacitive elements.

20. The apparatus of claim 1, wherein the apparatus is configured to be flexible.

21. The apparatus of claim 1, wherein the apparatus forms part of a multimedia enhancement module.

22. The apparatus of claim 1, wherein the apparatus is configured for use in a portable electronic device.

23. A method of producing an apparatus, the method comprising: providing first and second circuit boards, the first and second circuit boards each comprising a capacitive element; configuring the first and second circuit boards to define a chamber between the first and second circuit boards with the capacitive elements contained therein and facing one another; and providing an electrolyte within the chamber to produce an apparatus, the apparatus comprising the first and second circuit boards and the electrolyte, wherein the apparatus is configured to store electrical charge when a potential difference is applied between the capacitive elements, and wherein the first and second circuit boards are defined by layers of electrically conductive material coated on either side by a layer of electrically insulating material.

24. The method of claim 23, wherein each capacitive element comprises an electrically conductive region having a surface, the method comprising applying a high surface area material to the surface of each electrically conductive region.

25. The method of claim 24, the method comprising preparing the high surface area material prior to application by mixing one or more of the following together and subsequently homogenising the mixture: activated carbon, carbon nanotubes, carbon nanohorns, carbon nanofibers and carbon nano-onions.

26. The method of claim 24, the method comprising annealing the high surface area material after application to consolidate the high surface area material.

27. The method of claim 24, the method comprising controlling the thickness of the high surface area material on the surface of each electrically conductive region to minimise the electrical resistance of the capacitive elements.

28. The method of claim 23, the method comprising sealing the first and second circuit boards together to contain the electrolyte within the chamber.

29. A method of storing electrical charge, the method comprising: providing an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements; and applying a potential difference between the capacitive elements, and wherein the first and second circuit boards are defined by layers of electrically conductive material coated on either side by a layer of electrically insulating material.

30. A computer program for controlling the storage of electrical charge using an apparatus, the apparatus comprising first and second circuit boards, and an electrolyte, the first and second circuit boards each comprising a capacitive element, wherein the apparatus is configured such that a chamber is defined between the first and second circuit boards with the capacitive elements contained therein and facing one another, the chamber comprising the electrolyte, and wherein the apparatus is configured to store electrical charge when a potential difference is applied between the capacitive elements, the computer program comprising code to apply a potential difference between the capacitive elements, and wherein the first and second circuit boards are defined by layers of electrically conductive material coated on either side by a layer of electrically insulating material.

* * * * *